United States Patent
Yamamoto et al.

(10) Patent No.: US 11,221,367 B2
(45) Date of Patent: Jan. 11, 2022

(54) EVALUATION DEVICE, ENERGY STORAGE SYSTEM, EVALUATION METHOD AND NON-TRANSITORY COMPUTER READABLE MEDIUM

(71) Applicant: KABUSHIKI KAISHA TOSHIBA, Minato-ku (JP)

(72) Inventors: Takahiro Yamamoto, Fuchu (JP); Hisaaki Hatano, Yokohama (JP); Masatake Sakuma, Kiyose (JP); Kenichi Fujiwara, Kawasaki (JP); Takenori Kobayashi, Meguro (JP); Tomohiro Toyosaki, Fuchu (JP); Yoshiyuki Sakamoto, Fuchu (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 81 days.

(21) Appl. No.: 16/567,743

(22) Filed: Sep. 11, 2019

(65) Prior Publication Data
US 2020/0003839 A1    Jan. 2, 2020

Related U.S. Application Data

(63) Continuation of application No. PCT/JP2017/042821, filed on Nov. 29, 2017.

(51) Int. Cl.
*G01R 31/367* (2019.01)
*G01R 31/392* (2019.01)
(Continued)

(52) U.S. Cl.
CPC ......... *G01R 31/367* (2019.01); *G01R 31/392* (2019.01); *G06F 16/2379* (2019.01); *G06F 16/2455* (2019.01)

(58) Field of Classification Search
CPC . G01R 31/367; G01R 31/392; G06F 16/2379; G06F 16/2455
See application file for complete search history.

(56) References Cited

U.S. PATENT DOCUMENTS

| 5,596,260 A | 1/1997 | Moravec et al. |
| 7,009,401 B2 | 3/2006 | Kinoshita et al. |

(Continued)

FOREIGN PATENT DOCUMENTS

| CN | 106796267 A | 5/2017 |
| JP | 2004-138586 A | 5/2004 |

(Continued)

OTHER PUBLICATIONS

International Preliminary Report on Patentability English translation dated Jun. 11, 2020, in PCT/JP2017/042821, 6 pages.

(Continued)

*Primary Examiner* — Raymond L Nimox
(74) *Attorney, Agent, or Firm* — Oblon, McClelland, Maier & Neustadt, L.L.P.

(57) ABSTRACT

According to one embodiment, an evaluation device includes first processing circuitry and second processing circuitry. The first processing circuitry calculates a feature value of an energy storage device based on voltage values measured from the energy storage device being subjected to charge-discharge-control according to charge-discharge command values. The second processing circuitry derives an evaluation function of a degradation state of the energy storage device according to a difference between a distribution of the charge-discharge command values and a reference distribution. The second processing circuitry evaluates the degradation state of the energy storage device, based on the evaluation function and the calculated feature value.

19 Claims, 14 Drawing Sheets

(51) Int. Cl.
*G06F 16/23* (2019.01)
*G06F 16/2455* (2019.01)

(56) References Cited

U.S. PATENT DOCUMENTS

| | | |
|---|---|---|
| 10,310,018 B2 | 6/2019 | Sakuma et al. |
| 10,367,359 B2 * | 7/2019 | Ikeda .................. H01M 10/425 |
| 2014/0084867 A1 * | 3/2014 | Hamaoka .................. H02J 7/02 |
| | | 320/116 |
| 2015/0046109 A1 | 2/2015 | Miwa et al. |
| 2016/0336767 A1 * | 11/2016 | Zane .................... H02J 7/0068 |
| 2017/0031404 A1 * | 2/2017 | Yamamoto ................ G06F 1/28 |
| 2017/0263984 A1 * | 9/2017 | Fujita .................. H01M 10/482 |
| 2018/0267108 A1 * | 9/2018 | Morita ................. G01R 31/367 |
| 2018/0269546 A1 | 9/2018 | Fujiwara et al. |

FOREIGN PATENT DOCUMENTS

| | | |
|---|---|---|
| JP | 2013-225441 A | 10/2013 |
| JP | 2015-31674 A | 2/2015 |
| JP | WO 2017/022037 A1 | 2/2017 |
| JP | 6134438 B1 | 5/2017 |
| JP | 6159474 B2 | 7/2017 |
| JP | 2018-156866 A | 10/2018 |
| WO | WO 2016/157420 A1 | 10/2016 |

OTHER PUBLICATIONS

International Search Report dated Feb. 13, 2018 in PCT/JP2017/042821 filed Nov. 29, 2017.

* cited by examiner

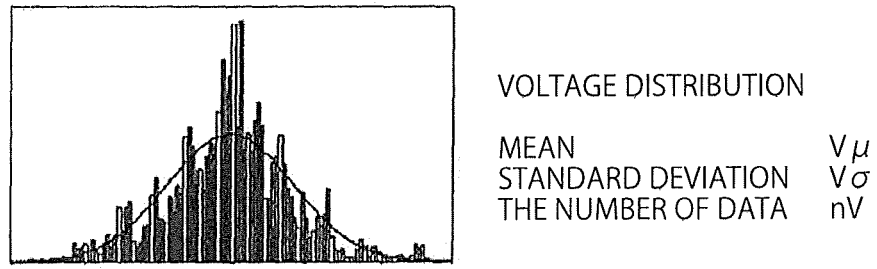
FIG. 8
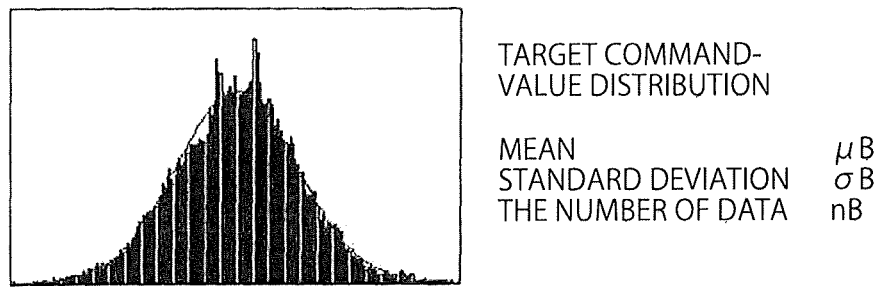
FIG. 9
| PATTERN | STATISTICAL INFORMATION | TEMPERATURE T [°C] | COEFFICIENT a | COEFFICIENT b |
|---|---|---|---|---|
| REFERENCE DISTRIBUTION 1 | $\sigma 1$ $\mu 1$ $n1$ | 24.0 | $A_{1-1}$ | $B_{1-1}$ |
| | | 36.0 | $A_{1-2}$ | $B_{1-2}$ |
| | | 40.0 | $A_{1-3}$ | $B_{1-3}$ |
| REFERENCE DISTRIBUTION 2 | $\sigma 2$ $\mu 2$ $n2$ | 24.0 | $A_{2-1}$ | $B_{2-1}$ |
| | | 36.0 | $A_{2-2}$ | $B_{2-2}$ |
| | | 40.0 | $A_{2-3}$ | $B_{2-3}$ |
| REFERENCE DISTRIBUTION 3 | $\sigma 3$ $\mu 3$ $n3$ | 24.0 | $A_{3-1}$ | $B_{3-1}$ |
| | | 36.0 | $A_{3-2}$ | $B_{3-2}$ |
| | | 40.0 | $A_{3-3}$ | $B_{3-3}$ |
FIG. 10

EVALUATION DEVICE, ENERGY STORAGE SYSTEM, EVALUATION METHOD AND NON-TRANSITORY COMPUTER READABLE MEDIUM

CROSS REFERENCE TO RELATED APPLICATIONS

This application is a Continuation of International Application No. PCT/JP2017/042821, filed on Nov. 29, 2017, the entire contents of which is hereby incorporated by reference.

FIELD

The present disclosure relates to an evaluation device, an energy storage system, an evaluation method, and a computer program.

BACKGROUND

An energy storage system (ESS: Energy Storage System) is provided with a charge-discharge function and is used for improving electric power quality such as stabilization of the electric power supplied by an electric power system and suppression of frequency fluctuation in the electric power system. The energy storage system is also used for reducing the peak usage amounts of consumers. Such an energy storage system is expected to expand a market in the future.

For use to improve the electric power quality of the electric power system, the energy storage system basically operates over 24 hours and 365 days. Accordingly, for the degradation evaluation of the energy storage system, it is desired to perform the degradation evaluation without stopping the function of the energy storage system. A current mainstream is to estimate degradation based on charge-discharge histories. However, at present, only charge-discharge histories for short periods exist. State evaluation in the operation of a long period, such as 20 years, has not been achieved yet. Meanwhile, there is a method of carrying out degradation estimation by monitoring of the energy storage system and remote monitoring; however, this has not yet been achieved either. For an energy storage system for a vehicle-mounted use or an electricity-distribution-side use, precise degradation evaluation can be performed by stopping the energy storage system and performing a charge-discharge test because it is of no matter to stop the operation of the energy storage system. However, for an energy storage system used for improving electric power quality in the electric power system, this method is not realistic because it is not allowed to stop the energy storage system in operation.

BRIEF DESCRIPTION OF THE DRAWINGS

FIG. 8 shows an example of a voltage distribution and statistical information thereof;

FIG. 9 shows an example of a target command-value distribution;

FIG. 10 shows a data example of a reference database;

DETAILED DESCRIPTION

Figure 1:
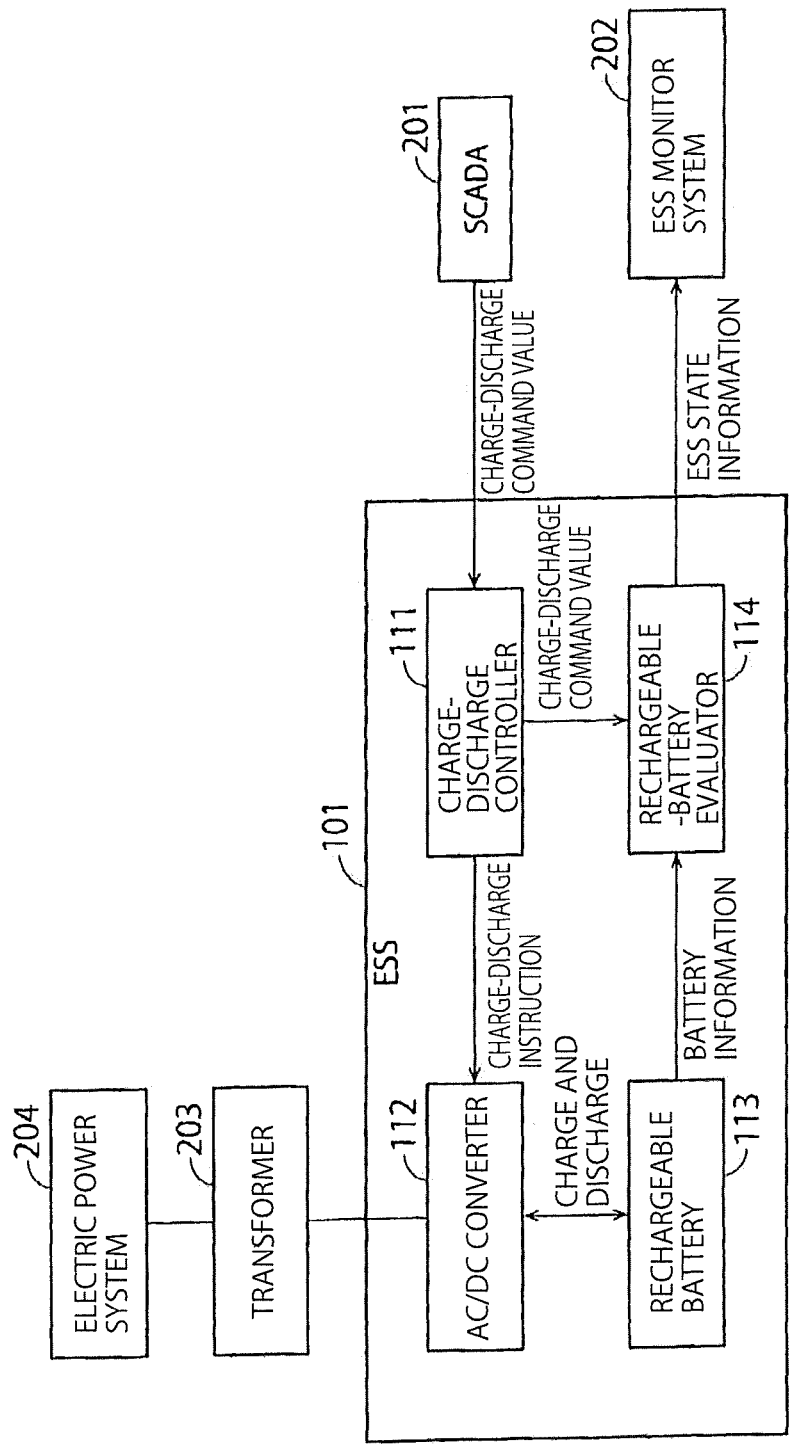
FIG. 1 shows an energy storage system according to an embodiment of the present invention.

According to one embodiment, an evaluation device includes first processing circuitry and second processing circuitry. The first processing circuitry calculates a feature value of an energy storage device based on voltage values measured from the energy storage device being subjected to charge-discharge-control according to charge-discharge command values. The second processing circuitry derives an evaluation function of a degradation state of the energy storage device according to a difference between a distribution of the charge-discharge command values and a reference distribution. The second processing circuitry evaluates the degradation state of the energy storage device, based on the evaluation function and the calculated feature value.

Hereinafter, referring to the drawings, embodiments of the present invention are described.

FIG. 1 shows an energy storage system (ESS) 101 according to an embodiment of the present invention. The energy storage system 101 includes: a charge-discharge controller 111, an AC/DC converter 112, a rechargeable battery 113, and a rechargeable battery evaluator 114 corresponding to an energy-storage evaluation device according to this embodiment. The energy storage system 101 has a function of performing charge and discharge for an electric power system in response to charge-discharge command values (electric power command values) received from a SCADA (Supervisory Control And Data Acquisition) 201. The energy storage system 101 has a function of performing degradation evaluation of the rechargeable battery 113, generates ESS state information indicating the state of the rechargeable battery 113, and notifies the generated ESS state information to an ESS monitor system 202.

The energy storage system 101 is connected to an electric power system 204 via a transformer 203. The transformer 203 converts the voltage of the electric power transmitted from the electric power system 204, and supplies the electric power having the converted voltage to the energy storage system 101. The transformer 203 converts the electric power discharged from the energy storage system 101, into a voltage for the electric power system 204, and supplies the converted electric power to the electric power system 204.

The energy storage system 101 is connected to the SCADA 201 via a communication network. The SCADA 201 regards various energy storage systems (ESSs) 101 residing in an area as a single large ESS, and transmits charge-discharge command values (electric power command values) of charge-discharge electric power to the individual ESSs in the large ESS at every predetermined time. Charge and discharge of individual ESSs are thus controlled. The charge-discharge command value includes both or at least one of a command value of charge and a command value of discharge. The energy storage system 101 in FIG. 1 corresponds to one of the various ESSs residing in the area. The SCADA 201 controls charge and discharge of each ESS based on a command from a upper-level energy management system, such as a central load dispatching office of an electric power company, a command from an energy management system on an electricity distribution side, or both of them.

The energy storage system 101 is connected to the ESS monitor system 202 via the communication network. The ESS monitor system 202 monitors the energy storage system 101 based on the ESS state information provided from the energy storage system 101. The ESS monitor system 202 generates screen data based on monitoring, and displays the generated screen data on a monitor. A monitor operator refers to the state of the ESS to be monitored, by checking a screen displayed on the monitor. The ESS monitor system 202 may control operation of the ESS in response to a monitoring result or in response to commands given by the monitor operator.

The communication network between the energy storage system 101 and the ESS monitor system 202, and the communication network between the SCADA 201 and the energy storage system 101 may be the identical to or different from each other. The communication network may be a wireless network, a wired network, or a mixture thereof. The communication protocol may be a protocol uniquely defined for the SCADA 201 or the ESS 101, may be a general-purpose protocol, or may be a protocol based on the general-purpose protocol.

The charge-discharge controller 111 of the energy storage system 101 receives the charge-discharge command value from the SCADA 201 at every predetermined time. The charge-discharge controller 111 generates an instruction (charge-discharge instruction) of charge or discharge for the AC/DC converter 112 based on the received charge-discharge command value. The charge-discharge controller 111 transmits the generated charge-discharge instruction to the AC/DC converter 112. If the AC/DC converter 112 can interpret the charge-discharge command value as it is, the charge-discharge command value may be transmitted as it is by the charge-discharge controller 111. The charge-discharge controller 111 transmits the received charge-discharge command value to the rechargeable battery evaluator 114. In this process, the charge-discharge controller 111 may convert the charge-discharge command value into a format that can be interpreted by the rechargeable battery evaluator 114, and transmit the converted charge-discharge command value to the rechargeable battery evaluator 114.

The AC/DC converter 112 has a function of bidirectionally converting AC electric power in the electric power system 204 and DC electric power in the rechargeable battery 113. The AC/DC converter 112 may include a single AC/DC converter or may be freely connected converters of two or more types among an AC/DC converter, a DC/DC converter, and an AC/AC converter. For example, an AC/DC converter and a DC/DC converter may be directly connected, an AC/AC converter and an AC/DC converter may be directly connected, or an AC/AC converter, an AC/DC converter, and a DC/DC converter may be connected in series in this order. The AC/DC converter 112 executes charge and discharge for the rechargeable battery 113 in response to the charge-discharge instruction from the charge-discharge controller 111.

The rechargeable battery 113 is a rechargeable battery that can accumulate and discharge electric energy. The rechargeable battery 113 includes, for example, one or more battery units. For example, each battery unit includes one or more battery modules, and one BMU (Battery Management Unit: battery manager). Each battery module includes a plurality of unit batteries (cells). Each battery module may include one CMU (Cell Monitoring Unit: cell monitor). The numbers of the battery modules included in the corresponding battery units may be identical to or different from each other. The numbers of the cells included in the corresponding battery modules may be identical to or different from each other. A plurality of the BMUs may be included in each battery unit and and a plurality of the CMUs may be included in each battery module.

The rechargeable battery 113 discharges the electric power accumulated in the cells, to the AC/DC converter 112, in response to a discharge instruction from the AC/DC converter 112. The rechargeable battery 113 charges the cells with the electric power, in response to a charge instruction from the AC/DC converter 112. The electric power to be charged with is electric power converted into DC by the AC/DC converter 112. Each of the cell, the battery module, the battery unit, and the rechargeable battery is a mode of an energy storage device, which internally accumulates electric energy. In this embodiment, any mode of energy storage device can be a target of degradation evaluation. The energy storage device to be subjected to degradation evaluation may be any of the cell, the battery module, the battery unit, and the rechargeable battery. In the following description, the rechargeable battery 113 is assumed as the energy storage device.

Figure 2:
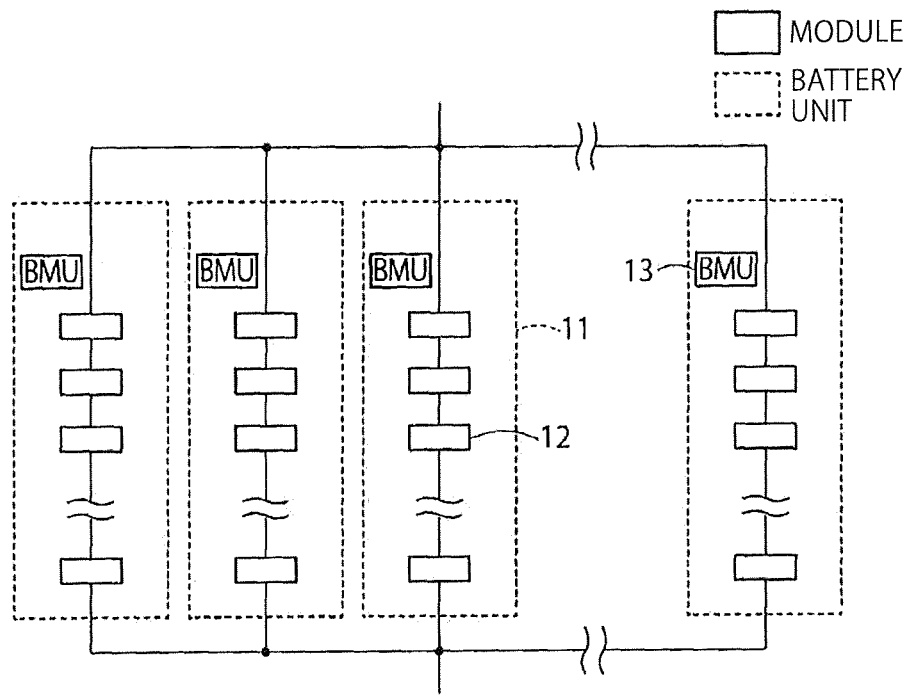
FIG. 2 shows a configuration example of a rechargeable battery.

FIG. 2 shows a configuration example of the rechargeable battery 113. A plurality of battery units 11 are connected in parallel. The battery units 11 connected in parallel constitute a battery array. Each battery unit 11 includes a plurality of battery modules 12. The battery modules 12 are connected in series. Each battery unit 11 includes a BMU 13.

The configuration in FIG. 2 is an example. Another configuration may be adopted. For example, the plurality of battery modules 12 may be connected in parallel or in series and parallel. The plurality of battery units 11 may be connected in series or in series and parallel. The battery unit 11 may include a communicator that transmits and receives information to and from the rechargeable battery evaluator 114. For example, the communicator may be provided in the BMU 13 on the battery unit 11. Alternatively, the communicator may be disposed at a place other than the battery unit 11 within the ESS.

Figure 3:
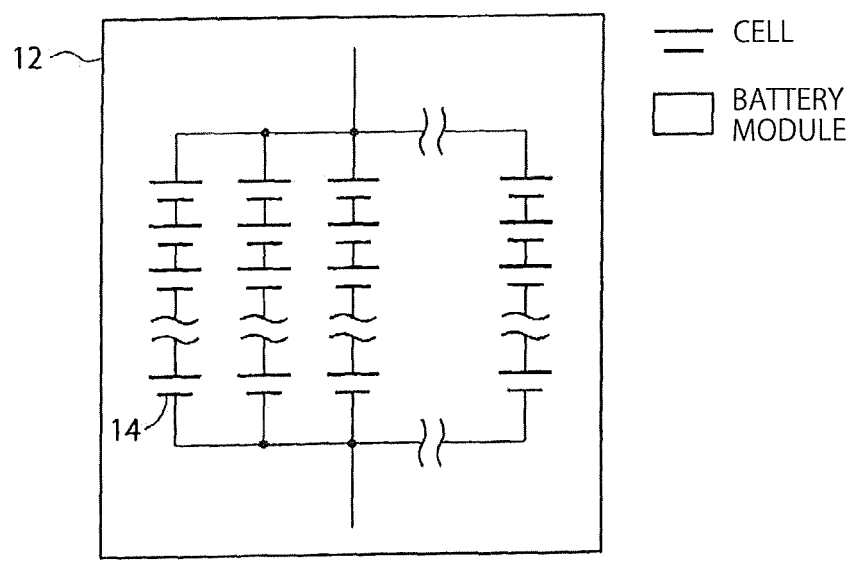
FIG. 3 shows an example of a configuration of a battery module.

FIG. 3 shows an example of a configuration of the battery module 12. The battery module 12 includes a plurality of cells 14. The cells 14 are connected in series and parallel. The configuration in FIG. 3 is an example. Another configuration can be adopted. For example, the cells 14 may be connected only in series, or connected only in parallel. The battery module 12 may include a CMU. The cells 14 are chargeable and dischargeable secondary batteries. Examples of the secondary batteries include lithium-ion batteries, lithium-ion polymer batteries, lead rechargeable batteries, nickel-cadmium batteries, and nickel-hydrogen batteries.

A measuring device (not shown) that measures parameters, such as the voltage, current, and temperature, is disposed for each of the cells. Likewise, a measuring device (not shown) that measures parameters, such as the voltage, current, and temperature of the battery module, is disposed for each of the battery modules 12. Furthermore, a measuring device (not shown) that measures parameters, such as the voltage, current, and temperature of the battery unit, is disposed for each of the battery units. Furthermore, a measuring device (not shown) that measures parameters, such as the voltage, current, and temperature of the rechargeable battery 113, is disposed for the array (rechargeable battery 113). Here, the measuring devices, which measure the voltages, currents, temperatures and the like, are thus disposed for all the cells, the battery modules, the battery units, and the rechargeable battery 113. Alternatively, the measuring device(s) may be disposed only for some of them. Alternatively, the measuring devices may be disposed only for some of the cells instead of all the cells. This is also applicable to the battery modules or the battery units. Each measuring device may measure not only the voltage, current and temperature but also another parameter, such as humidity, for example.

The rechargeable battery 113 transmits, to the rechargeable battery evaluator 114, battery information of the evaluation-target energy storage device (the rechargeable battery 113 is herein assumed). The battery information includes the parameters (the voltage, current, temperature, etc.) measured by the measuring for the evaluation-target rechargeable battery.

The rechargeable battery 113 may include an auxiliary cell, an auxiliary battery module, or an auxiliary battery unit. In this case, it may be configured that if a cell, a battery module or a battery unit fails, the failed cell, the failed battery module or the failed battery unit is switched to the auxiliary cell, the auxiliary battery module or the auxiliary battery unit.

The rechargeable battery evaluator 114 receives the battery information from the rechargeable battery 113. The rechargeable battery evaluator 114 receives the charge-discharge command value from the charge-discharge controller 111. The rechargeable battery evaluator 114 evaluates the degradation state of the evaluation-target rechargeable battery, based on the received battery information on the rechargeable battery and the received charge-discharge command value. The rechargeable battery evaluator 114 transmits, to the ESS monitor system 202, the ESS state information associated with the degradation state of the rechargeable battery.

Figure 4:
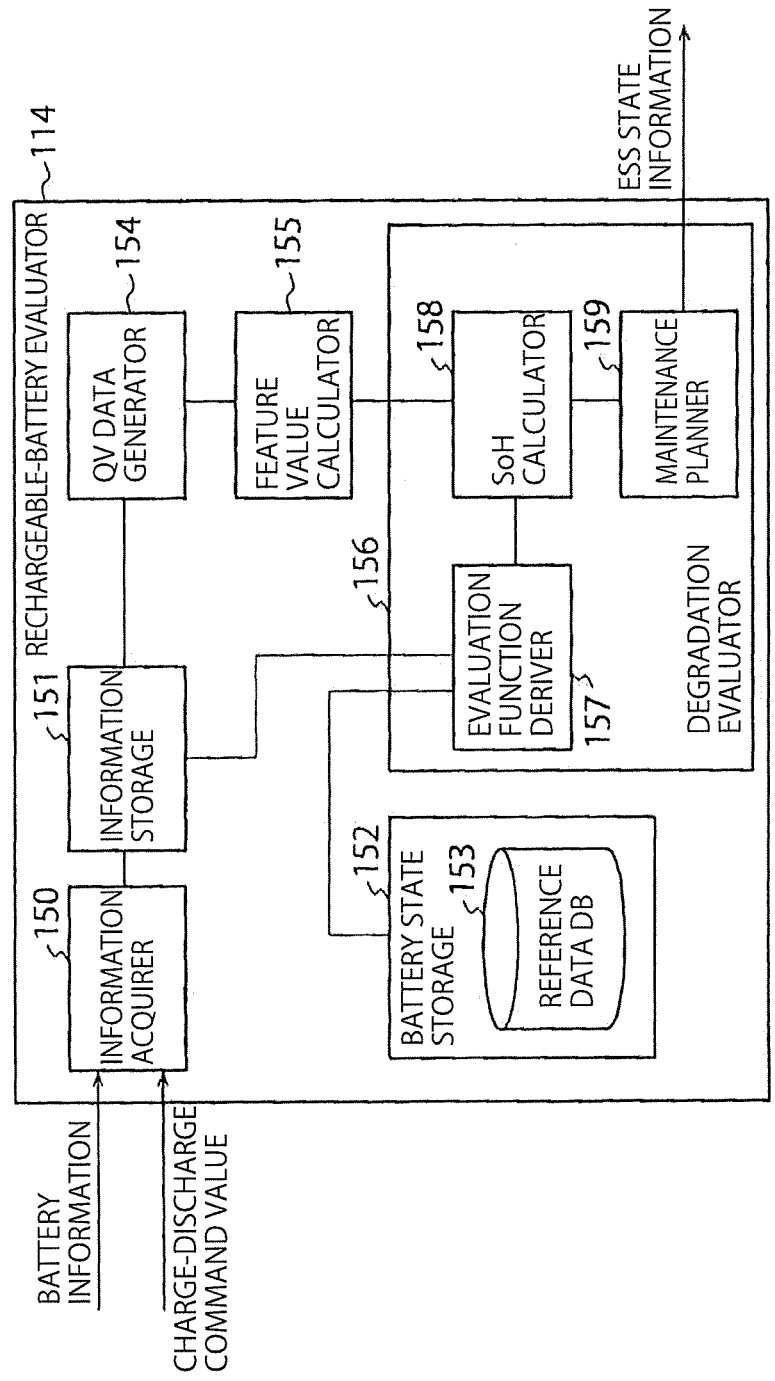
FIG. 4 is a block diagram showing a configuration of an evaluator.

FIG. 4 is a block diagram showing a configuration of the rechargeable battery evaluator 114. The rechargeable battery evaluator 114 includes an information acquirer 150, an information storage 151, a battery state storage 152, a QV data generator 154, a feature value calculator 155, and a degradation evaluator 156. The battery state storage 152 includes a reference database (DB) 153. The degradation evaluator 156 includes an evaluation function deriver 157, an SoH calculator 158, and a maintenance planner 159.

The information acquirer 150 is electrically connected to the rechargeable battery 113, and receives the battery information (the current, voltage, temperature, etc.) from the rechargeable battery 113. The information storage 151 internally stores the battery information acquired by the information acquirer 150. Time information may be added to the battery information. Alternatively, the information acquirer 150 may acquire the time information from a clock that counts time, and store the received battery information in association with the time information. The information acquirer 150 may generate data representing the amount of charge (the charge amount accumulated in the rechargeable battery) of the rechargeable battery, by integrating the current values in the battery information. The amount of charge may be represented by SOC (State of Charge) as a ratio of the charge amount to the capacity of the rechargeable battery, for example.

The information acquirer 150 acquires the charge-discharge command value from the charge-discharge controller 111. The information storage 151 internally stores the charge-discharge command value acquired by the information acquirer 150. Time information may be added to the charge-discharge command value. Alternatively, the information acquirer 150 may acquire the time information from the clock that counts time, and store the received charge-discharge command value in association with the time information.

Referring to FIGS. 5A to 5C and 6A and 6B, a specific example of data to be stored in the information storage 151 is described.

Figure 5A:
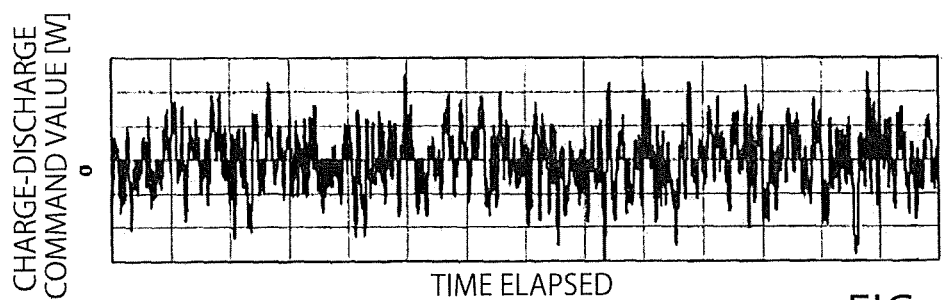
FIGS. 5A to 5C respectively show graph examples of charge-discharge command value data, voltage data, and current data.

FIG. 5A shows a graph representing the charge-discharge command value against time. Values larger than 0 are discharge command values. Values smaller than 0 are charge command values.

Figure 5B:
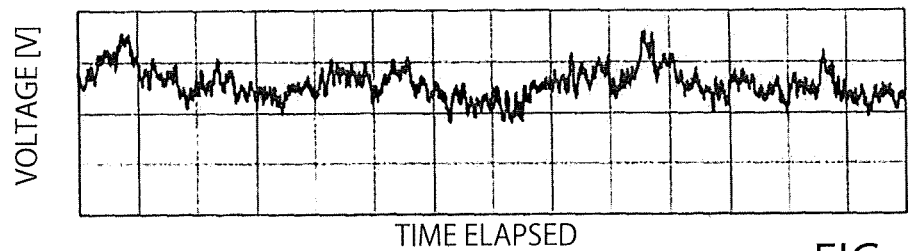

FIG. 5B shows a graph representing the voltage value in the battery information against time.

Figure 5C:
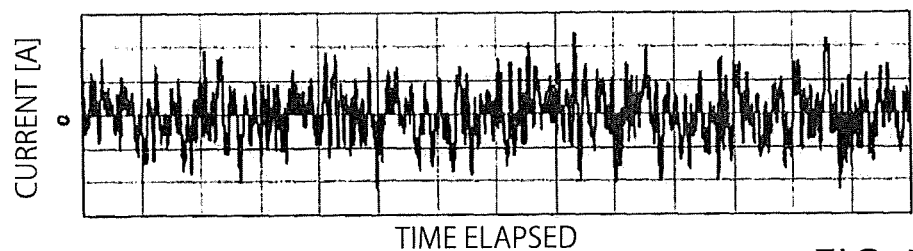

FIG. 5C shows a graph representing the current value in the battery information against time. Values larger than 0 are discharge currents. Values smaller than 0 are charge currents.

Figure 6A:
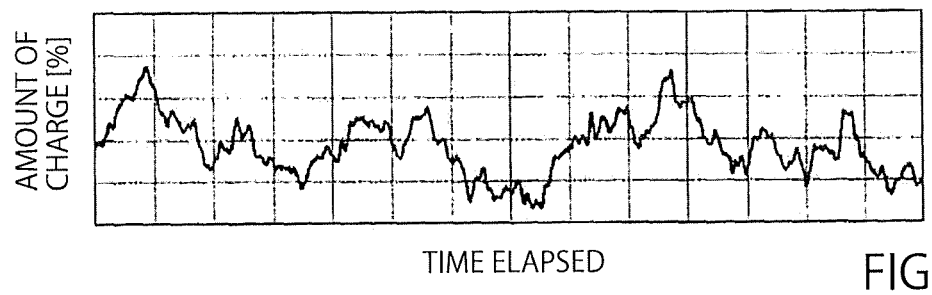
FIGS. 6A and 6B respectively show graph examples of amount-of-charge data and temperature data.

FIG. 6A shows a graph representing the amount of charge of the rechargeable battery against time. Here, the amount of charge is represented by SOC (State Of Charge). The unit of SOC is "%." Note that it may be arbitrary defined, for example, the case in which the amount of charge is "0" may be defined as "0%", the predetermined capacity (the capacity defined by the specifications) may be defined as "100%." Alternatively, a lower limit and an upper limit of a predetermined range may be defined as "0%" and "100%," respectively. This graph is acquired by accumulating (integrating) the charged or discharged currents, with reference to the amount of charge at the point of charge-discharge start.

Figure 6B:
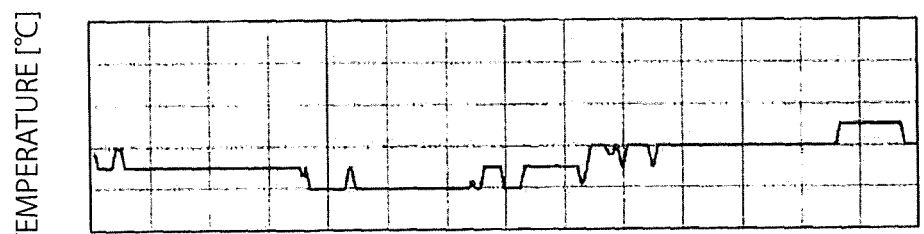

FIG. 6B shows a graph of temperature data representing the temperature of the rechargeable battery against time. The temperature may be the mean temperature from a start of the charge-discharge, or the mean temperature value for a constant period of time immediately before.

Data other than that shown in FIGS. 5A to 5C and 6A and 6B may be acquired from the rechargeable battery 113 or the charge-discharge controller 111.

Figure 7A:
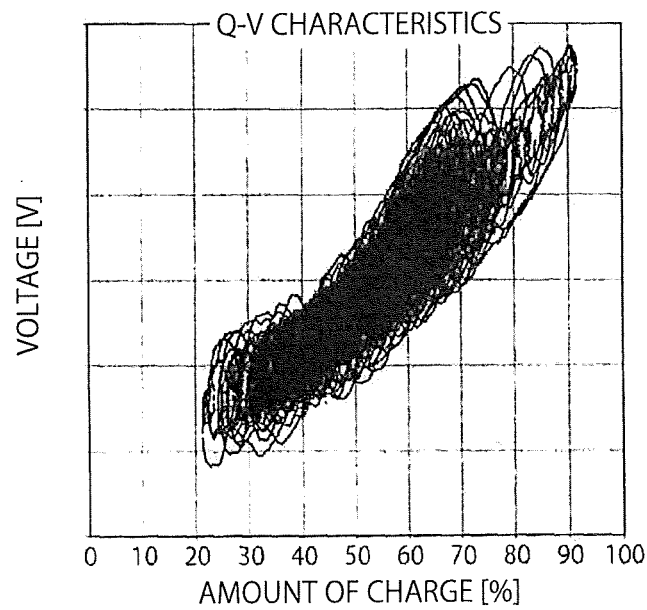
FIGS. 7A and 7B show examples of QV data.
Figure 7B:
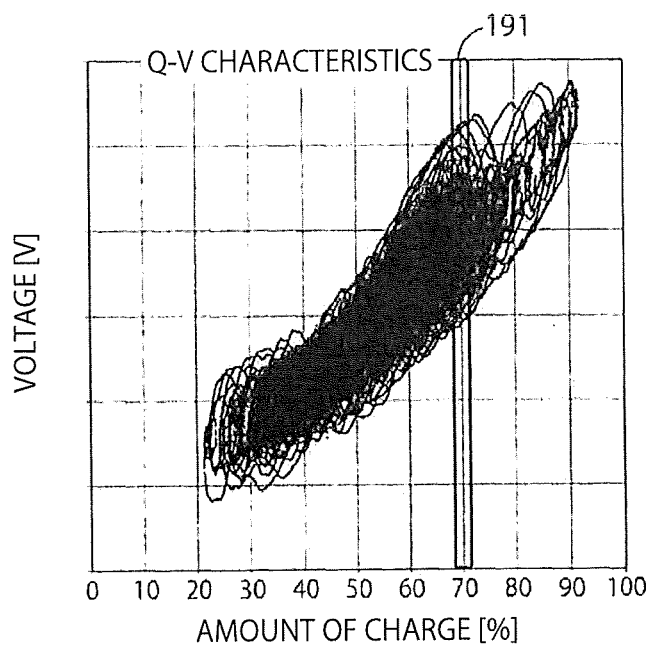

The QV data generator 154 generates QV data that includes correspondence data items associating between the amounts of charge and the voltages, based on the information stored in the information storage 151. The relationship between the amount of charge and the voltage is, in some cases, called Q-V characteristics. The correspondence data is acquired by associating the amount of charge (see FIG. 6A) with the voltage (FIG. 5B) on a one-to-one basis, for example. A plurality of the correspondence data items are acquired by acquiring the correspondence data item for each sample of the battery information. FIG. 7A shows a graph example of the QV data where the plurality of correspondence data items are plotted on a coordinate system having axes of the amount of charge (Q) and the voltage (V). The amount of charge is represented by SOC (%). FIG. 7B shows a predetermined amount-of-charge range (evaluation range) 191 set on the graph of FIG. 7A. The predetermined amount-of-charge range 191 is a range larger than 69 and less than 71 in this example. Based on the feature value (degradation feature value) associated with variation in voltages in the predetermined amount-of-charge range 191, the degradation state of the rechargeable battery can be evaluated. The reason thereof is described later.

The feature value calculator 155 acquires the distribution between the voltage value and the frequency from the correspondence data items (Q, V) belonging to the predetermined amount-of-charge range in the QV data generated by the QV data generator 154. Specifically, in FIG. 7B, the distribution between the voltage value and the frequency is acquired from the correspondence data items belonging to the predetermined amount-of-charge range 191. The acquired distribution is called a voltage distribution (V-distribution). An example of the voltage distribution is, for example, a histogram having an abscissa axis of voltage [V] and an ordinate axis of frequency (the number of times). The feature value calculator 155 calculates statistical information, such as the mean of the acquired voltage distribution and standard deviation of the acquired voltage distribution.

FIG. 8 shows an example of a V-distribution generated from the correspondence data items belonging to the predetermined amount-of-charge range 191 (see FIG. 7B) in the QV data, and statistical information thereof. A curve in the diagram is a normal distribution that approximates the histogram. The voltage distribution can be said to have normality. The mean is $V\mu$. The standard deviation is $V\sigma$. The number of samples (the number of data items) is nV.

The feature value calculator 155 calculates the degradation feature value of the rechargeable battery based on the voltage distribution or the statistical information. The degradation feature value may be any value that represents the variation in voltages. For example, the value is the standard deviation or the variance. The feature value calculator 155 sends data of the calculated degradation feature value to the degradation evaluator 156.

The degradation evaluator 156 evaluates the degradation state (State of Health: SoH) of the rechargeable battery based on the degradation feature value calculated by the feature value calculator 155. For the evaluation, the evaluation function for the degradation state of the rechargeable battery is used. The evaluation function is derived (generated) by the evaluation function deriver 157.

The evaluation function includes a variable to be assigned the degradation feature value, and a coefficient for the variable. The evaluation function may include a constant term. Hereinafter, the constant term is also called a coefficient. The form of the evaluation function is, for example, a linear function, or n-th order function (n is an integer of 2 or more). However, the form is not limited to specific one. In the following description, a linear function "$y = a \times x + b$" is assumed as the evaluation function. In this case, "a" and "b" represent coefficients, "x" represents a variable (input variable) assigned the degradation feature value, and "y" represents a variable (output variable) assigned the degradation state value. For example, the ratio of the present capacity to the initial capacity of the rechargeable battery (present capacity/initial capacity), the internal resistance value, or another type of value may be used as an indicator representing the degradation state.

The evaluation function deriver 157 identifies the charge-discharge command values belonging to the predetermined amount-of-charge range 191 among the charge-discharge command values stored in the information storage 151, and generates the command-value distribution (target command-value distribution) representing the relationship between the identified charge-discharge command values and their frequencies. The charge-discharge command values belonging to the predetermined amount-of-charge range 191 is the charge-discharge command values when the amount of charge of the rechargeable battery 113 as results of the charge-discharge control of the charge-discharge command values comes into the predetermined amount-of-charge range.

FIG. 9 shows an example of the target command-value distribution generated by the evaluation function deriver 157. The abscissa axis indicates the charge-discharge command value. The ordinate axis indicates the frequency (the number of times). For example, the charge-discharge command value larger than 0 is a discharge instruction, and the charge-discharge command value smaller than 0 is a charge instruction. A curve in the diagram is a normal distribution that approximates the histogram. This histogram can be said to have normality.

The evaluation function deriver 157 calculates statistical information based on the target command-value distribution. Examples of the statistical information include the mean, the standard deviation, and the number of data items. The mean $\mu B$, the standard deviation $\sigma B$, and the number of data items nB calculated from the target command-value distribution are shown in FIG. 9.

The battery state storage 152 stores the reference database 153. The reference database 153 holds the coefficients of the evaluation function for each of a plurality of temperatures, with respect to a plurality of reference distributions of the charge-discharge command values (see FIG. 10 described later). That is, for each pair of the reference distribution and the temperature, the coefficients of the evaluation function are registered. The form of the evaluation function is predetermined. In the following description, the coefficients of the evaluation function being registered in the reference database 153 is sometimes called as the evaluation function being registered. The evaluation function for each pair of the reference distribution and the temperature is preliminarily created through measurement, and is registered in the reference database 153.

The reason that the degradation state of the rechargeable battery can be evaluated from the degradation feature value (standard deviation etc.) associated with variation in voltage values belonging to the predetermined amount-of-charge range, and a method of deriving the evaluation function are described (this can be applied for the battery cell, battery module, and battery unit).

Depending on the charge-discharge command value to be executed, current to be input into or output from the rechargeable battery varies. The internal resistance of the rechargeable battery varies depending on the input or output current. Accordingly, as understood also from FIG. 7A, the relationship between the amount of charge and the voltage does not become constant (does not form a linear line). Being dependent on the type (the model number, material, etc.) and the degradation state of the rechargeable battery, there is an amount-of-charge range where a variation in voltages significantly appears in the relationship (QV characteristics) between the amount of charge and the voltage. Furthermore, even in the range, the voltage to be measured varies depending on the input current or the output current (depending on the charge-discharge command value to be executed) or depending on the amount of charge (SOC) at the time.

The rechargeable batteries (rechargeable batteries of the same type) having a plurality of degradation states are charged or discharged, using a plurality of patterns of charge-discharge command values, at a plurality of temperatures. Accordingly, for each pair of the pattern and the temperature, a plurality of QV data items corresponding to the respective degradation states are acquired. The amount-of-charge range where the variation in voltages largely changes depending on the degradation state in the QV data is commonly identified among the plurality of degradation states. At this time, identifying the amount-of-charge range into a narrow range can absorb the difference of the amounts of charge (SOC) of the rechargeable batteries when the charge-discharge command value is executed in the amount-of-charge range. For each pair of the pattern and the temperature, the evaluation function (degradation evaluation data) for calculating the degradation state from the degradation feature value representing the variation in voltages in the amount-of-charge range is derived. In the charge-discharge instructions for the corresponding patterns, the charge-discharge command values belonging to the amount-of-charge range are determined as the reference command value distributions, respectively. Accordingly, for each pair of the reference command value distribution and the temperature, the evaluation function can be derived. The coefficients of the thus derived evaluation function are registered in the reference database 153.

Figure 11:
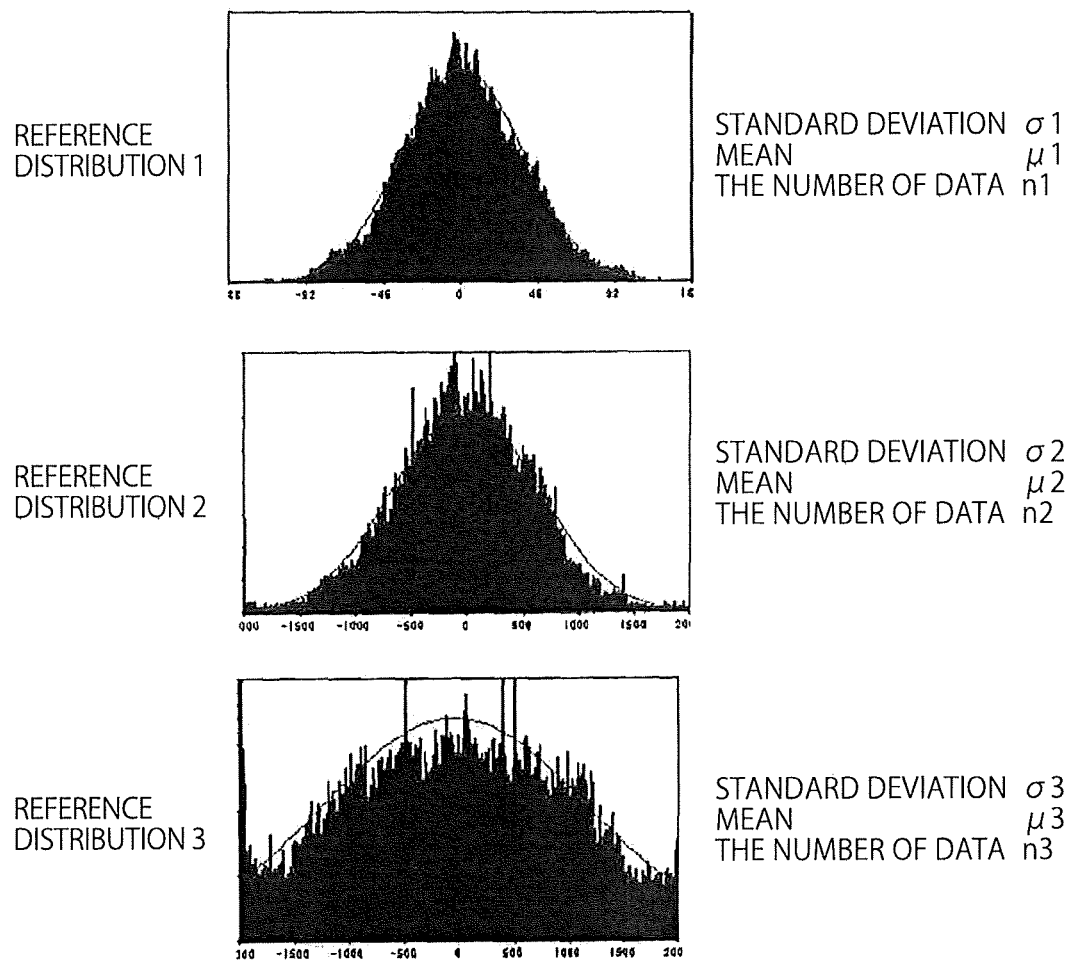
FIG. 11 shows examples of three reference distributions and statistical information thereof.

FIG. 10 shows an example of the reference database 153. For each of a reference distribution 1, a reference distribution 2 and a reference distribution 3, for three temperatures T (24.0° C., 36.0° C., 40.0° C.), the coefficient "a" and the coefficient "b" of the evaluation function are held. Furthermore, the statistical information on each reference distribution (here, the standard deviation, the mean, and the number of data items) is held. The evaluation function is $y=a \times x+b$. The reference distributions 1 to 3 are charge-discharge command value distributions having different patterns. FIG. 11 shows examples of the reference distributions 1 to 3. The standard deviation "σ1" of the reference distribution 1 is the smallest. The standard deviation "σ2" of the reference distribution 2 is the second smallest. The standard deviation "σ3" of the reference distribution 3 is the largest. "μ1," "μ2" and "μ3" are the means of the reference distributions 1, 2 and 3, respectively. "n1," "n2" and "n3" are the numbers of data items in the reference distributions 1, 2 and 3, respectively. In FIG. 10, the three temperatures are registered. Alternatively, more temperatures may be registered. The intervals between the adjacent temperatures are 12.0 and 4 in FIG. 10. Alternatively, narrower intervals, such as 1° C.-interval and 2° C.-interval, may be used.

Figure 12:
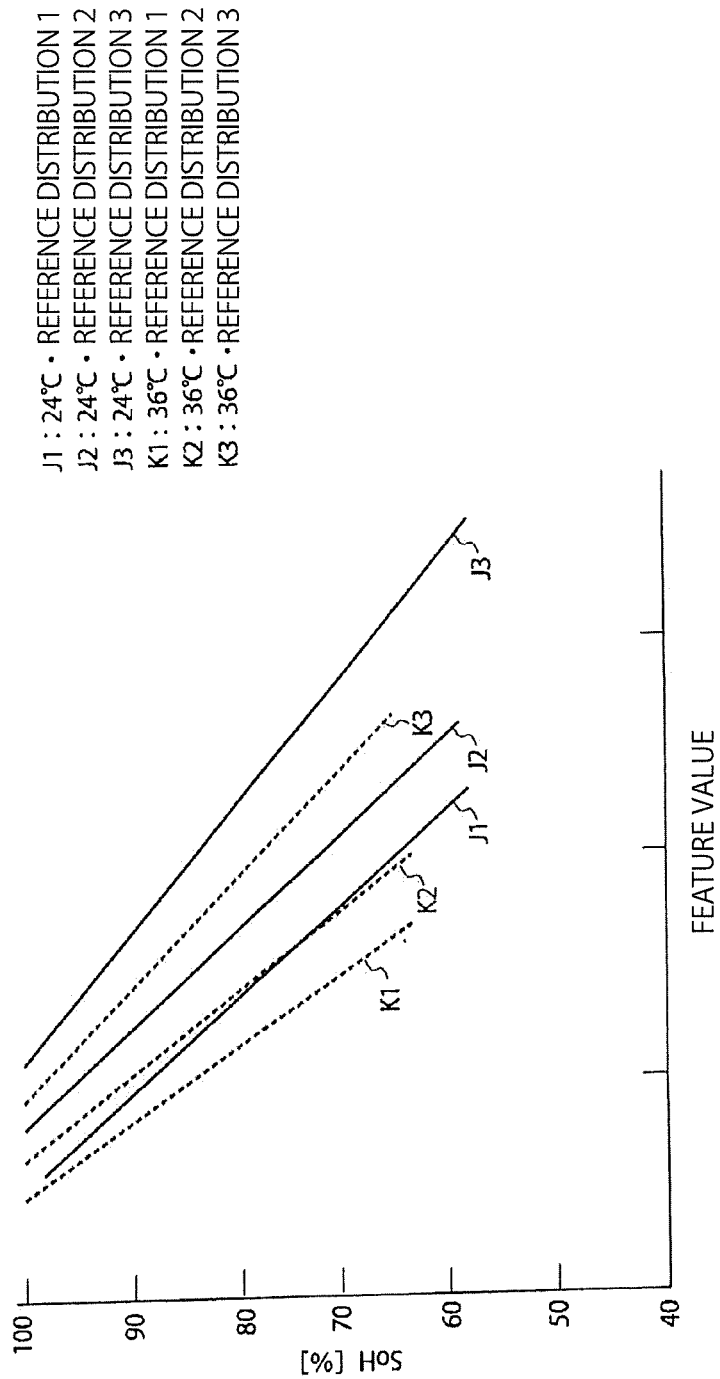
FIG. 12 shows a specific example of evaluation functions corresponding to the reference distributions.

FIG. 12 shows examples of the evaluation functions derived for temperatures of 24.0° C. and 36.0° C., for each of the reference distributions 1 to 3. The abscissa axis indicates the degradation feature value. The ordinate axis indicates the degradation state value (SoH). The evaluation function is a linear function. At the same temperature, the value of the intercept (variable "b") becomes larger in order of the reference distributions 1, 2 and 3. With the same reference distribution, the lower the temperature is, the smaller the value of the slope (variable "a") is (the larger the absolute value is). Here, only two temperatures are compared with each other. Similar tendency is found in cases of three or more temperatures. Accordingly, also for temperatures and reference distributions having not been calculated, the evaluation function (the coefficient "a" and coefficient "b") can be estimated by interpolation or extrapolation.

The evaluation function deriver 157 calculates the coefficient "a" and the coefficient "b" of the evaluation function used for degradation evaluation of the rechargeable battery, based on the degradation feature value (here, the standard deviation) calculated by the feature value calculator, the standard deviation σB of the target command-value distribution, and the representative temperature of the evaluation-target rechargeable battery. Specifically, based on the difference between the target command-value distribution and at least one reference distribution, interpolation or extrapolation are performed for the coefficient "a" and the coefficient "b" of the reference distribution, thereby deriving the coefficient "a" and the coefficient "b" of the evaluation function used for degradation evaluation. Hereinafter, a specific example of deriving the coefficient "a" and the coefficient "b" is described. The values of the coefficient "a" and the coefficient "b" to be derived are represented as "A" and "B", respectively.

(First deriving example) A case is assumed where the standard deviation σB of the target command-value distribution is larger than the standard deviation σ1 of the reference distribution 1 and smaller than the standard deviation σ2 of the reference distribution 2. In this case, the reference distribution 1 having the standard deviation σ1 that is smaller than and the closest to the standard deviation σB, and the reference distribution 2 having the standard deviation σ2 that is larger than and the closest to the standard deviation σB are selected. The representative temperature of the rechargeable battery is assumed as 24.0° C. The representative temperature of the rechargeable battery is, for example, the mean temperature over the evaluation-target period. Alternatively, the temperature may be the mean of temperatures when voltages belonging to the predetermined amount-of-charge range 191 are achieved.

The values $(A_{1-1}, B_{1-1})$ of the coefficient "a" and the coefficient "b" corresponding to the pair of the reference distribution 1 and a temperature of 24.0° C., and values $(A_{2-1}, B_{2-1})$ of the coefficient "a" and the coefficient "b" corresponding to the pair of the reference distribution 2 and a temperature of 24.0° C. are interpolated (subjected to interpolation), thereby deriving the coefficient "a" and the coefficient "b" of the evaluation function used for degradation evaluation. A calculation example is described below.

The value "$A$" of the coefficient "$a$"=$[(\sigma B-\sigma1)/(\sigma2-\sigma1)](A_{2-1}-A_{1-1})+A_{1-1}$ The value "$B$" of the coefficient "$b$"=$[(\sigma B-\sigma1)/(\sigma2-\sigma1)](B_{2-1}-B_{1-1})+B_{1-1}$ (Second deriving example) A case is discussed where the representative temperature of the rechargeable battery is not registered in the reference database in the first deriving example. As with the first deriving example, it is assumed that the standard deviation σB of the target command-value distribution is larger than σ1 and smaller than σ2. Note that the representative temperature of the rechargeable battery is assumed as 30.0° C. A temperature of 24.0° C., which is lower than and the closest to a temperature of 30.0° C., and a temperature 36.0° C., which is higher than and the closest to a temperature of 30.0° C., are selected.

In this case, first, for the reference distribution 1, the values (assumed as $A_{1-4}$ and $B_{1-4}$) of the coefficient "a" and the coefficient "b" corresponding to the temperature of 30.0° C. are acquired by interpolation.

$A_{1-4}=[(30-24)/(36-24)](A_{1-2}-A_{1-1})+A_{1-1}$ $B_{1-4}=[(30-24)/(36-24)](B_{1-2}-B_{1-1})+B_{1-1}$

Likewise, for the reference distribution 2, the values (assumed as $A_{2-4}$ and $B_{2-4}$) of the coefficient "a" and the coefficient "b" corresponding to the temperature of 30.0° C. are acquired by interpolation.

$$A_{2\text{-}4}=[(30-24)/(36-24)](A_{2\text{-}2}-A_{2\text{-}1})+A_{2\text{-}1}$$

$$B_{2\text{-}4}=[(30-24)/(36-24)](B_{2\text{-}2}-B_{2\text{-}1})+B_{2\text{-}1}$$

Subsequently, according to a method analogous to that of the first deriving example, the coefficient "a" and the coefficient "b" of the evaluation function used for degradation evaluation are derived. A calculation example is described below.

The value "A" of the coefficient "a"=$[(\sigma B-\sigma 1)/(\sigma 2-\sigma 1)](A_{2\text{-}4}-A_{1\text{-}4})+A_{1\text{-}4}$ The value "B" of the coefficient "b"=$[(\sigma B-\sigma 1)/(\sigma 2-\sigma 1)](B_{2\text{-}4}-B_{1\text{-}4})+B_{1\text{-}4}$ (Third deriving example) The first and second deriving examples use interpolation (interpolating). In a case where the temperature is lower than 24.0° C. or higher than 40.0° C., extrapolation may be applied. For example, the values of the coefficient "a" at temperatures of 24.0° C., 36.0° C. and 40.0° C. are mapped on a coordinate system having axes of the temperature and the coefficient "a" to acquire an approximation function between the temperature and the coefficient "a." The graph of the approximation function may be an approximate line or an approximate curve. The coefficient "a" at the representative temperature is acquired by inputting the representative temperature of the rechargeable battery (here, a temperature lower than 24.0° C. or higher than 40.0° C. is assumed) into the acquired approximation function. The method of acquiring the coefficient "b" is analogous. According to this method, for the two identified reference distributions, the coefficient "a" and the coefficient "b" at the representative temperature are acquired. Subsequently, as with the first and second examples, interpolation may be applied.

(Fourth deriving example) Also in a case where the standard deviation of the target command-value distribution is smaller than $\sigma 1$ or larger than $\sigma 3$, extrapolation may be applied as with the third deriving example. For example, the values of the coefficient "a" at the temperature T(24.0, 36.0 or 40.0) for the standard deviations $\sigma 1$, $\sigma 2$ and $\sigma 3$ are mapped on a coordinate system having axes of the standard deviation and the coefficient "a" to acquire an approximation function between the standard deviation and the coefficient "a" (an approximate line or an approximate curve). The coefficient "a" of the evaluation function used for degradation evaluation can be acquired by inputting the standard deviation of the target command-value distribution (the case where the standard deviation is smaller than $\sigma 1$ or larger than $\sigma 3$) into the acquired approximation function. The method of acquiring the coefficient "b" is analogous.

The methods of interpolation and extrapolation described here are only examples. Another method may be used. The difference of standard deviations is used as representing the difference between the target command-value distribution and the reference distribution; however, the difference between the mean values may be additionally used. For example, the coefficients derived in the embodiment described above may be multiplied by a value according to the difference of mean values.

The evaluation function deriver 157 generates the evaluation function where the values of the calculated coefficients are set, and transmits data of the generated evaluation function to the SoH calculator 158. If the evaluation function is y=ax+b and the values of the calculated coefficient "a" and coefficient "b" are "A" and "B," the function y=A×x+B is transmitted to the SoH calculator 158. Only "A" and "B" may be notified to the SoH calculator 158, while the form of the function may be held by the SoH calculator 158.

The SoH calculator 158 evaluates the degradation state (SoH) of the rechargeable battery, based on the degradation feature value calculated by the feature value calculator 155, and the evaluation function derived by the evaluation function deriver 157.

Figure 13:
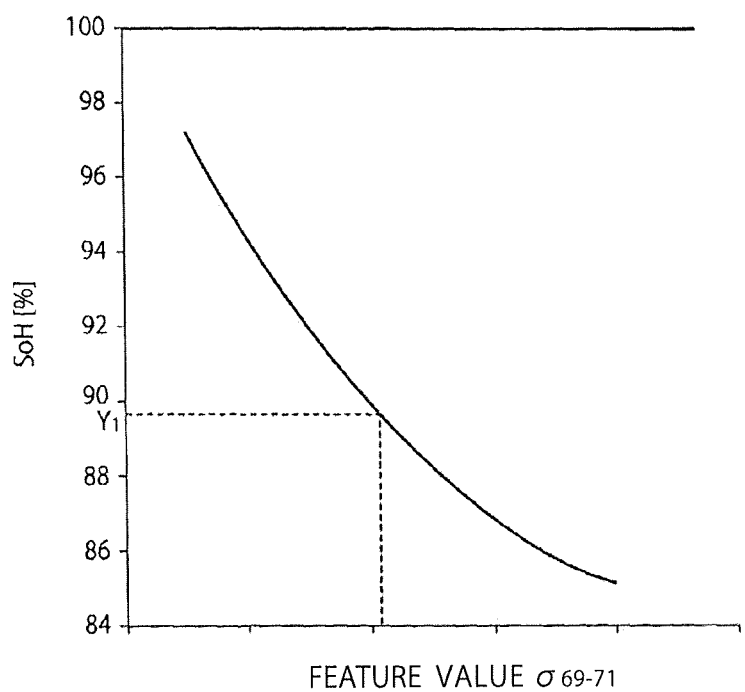
FIG. 13 shows an example of the derived evaluation function.

FIG. 13 shows an example of the derived evaluation function. The evaluation function associates the degradation feature value with SoH. The abscissa axis indicates the degradation feature value. The ordinate axis indicates SoH. Here, SoH is the percentage of the present capacity/initial capacity. The evaluation function is represented as a function $Y=f(V\sigma_{69\text{-}71})$. The output "Y" of the function indicates the SoH value. $V\sigma_{69\text{-}71}$ indicates the standard deviation of the voltages in the predetermined amount-of-charge range (here, a range larger than 69 and less than 71). The standard deviation calculated by the feature value calculator 155 is $V\sigma$. Accordingly, the degradation state value "$Y_1$" can be calculated from $Y=f(V\sigma)$.

The maintenance planner 159 generates information (ESS state information) associated with the degradation state of the rechargeable battery, based on the degradation state of the rechargeable battery calculated by the SoH calculator 158, or information stored in the information storage 151 and the battery state storage 152, or both of them. The maintenance planner 159 transmits the ESS state information to the ESS monitor system 202 via the communication network.

The maintenance planner 159 may determine the operation availability of the rechargeable battery based on the degradation state of the rechargeable battery, and transmit a message according to the determination result as the ESS state information, to the ESS monitor system 202. For example, this planner divides a range of values of a degradation state into three using a threshold "A" and a threshold "B," and acquires a range 1 equal to or less than the threshold "A," a range 2 higher than the threshold "A" and equal to or less than the threshold "B," and a range 3 equal to or higher than the threshold "B."

When the degradation state of the rechargeable battery belongs to the range 1, it is determined that further the rechargeable battery is not operable (that is, the life of the rechargeable battery is reached). In this case, the maintenance planner 159 may notify a message of a failure alert to the ESS monitor system 202.

When the degradation state belongs to the range 2, the maintenance planner 159 determines that the rechargeable battery is still operable but maintenance is required. In this case, the maintenance planner 159 may notify a message of a maintenance call to the ESS monitor system 202.

When the degradation state belongs to the range 3, the maintenance planner 159 determines that the rechargeable battery is normal and the operation is available also thereafter. In this case, the maintenance planner 159 may notify a message indicating that the rechargeable battery 113 is normal (there is no failure and maintenance is not required yet) to the ESS monitor system 202. Alternatively, such a notification is not necessarily issued.

The maintenance planner 159 may calculate a plurality of degradation states by a plurality of times of degradation evaluation, and determine the operation availability using the mean, median, maximum value or minimum value of these degradation states.

The maintenance planner 159 may transmit the charge-discharge command value data (electric power command value data), the voltage data, the current data, the amountof-charge data, and the temperature data, as the ESS state information. Voltage distribution data (voltage histogram) representing the distribution of the voltages in the predetermined amount-of-charge range, or data on a normal distribution approximating the voltage distribution, may be transmitted. The command value distribution data representing the distribution of the charge-discharge command values belonging to the predetermined amount-of-charge range, or data on a normal distribution approximating the command value distribution, may be transmitted. The derived evaluation function may be transmitted. Information representing the degradation state measured this time may be transmitted. The QV data may be transmitted. Data other than what is described here may be transmitted.

The ESS monitor system 202 receives the ESS state information from the ESS 101, and displays a screen (degradation state evaluation screen) for evaluating the degradation state of the rechargeable battery, on the display device, based on the ESS state information. If the operation availability information is included in the ESS state information, an operation according to the operation availability information may be performed. For example, when the operation availability information indicates that the operation is not operable, a message of a failure alert may be displayed on the screen. When the rechargeable battery is operable but maintenance is required, a message of a maintenance call may be displayed on the screen. When the rechargeable battery is normal, a message for notifying that the rechargeable battery is normal may be displayed on the screen. Besides displaying on the screen, a failure alert, a maintenance call, or a message sound for notifying the normal state of the rechargeable battery may be output through a speaker. A color may be displayed on the screen (for example, light on), for example, red when the rechargeable battery is not operable, yellow when the rechargeable battery is operable but maintenance is required, and green when the energy storage device is normal, thus notifying the operation state of the ESS 101.

Figure 14:
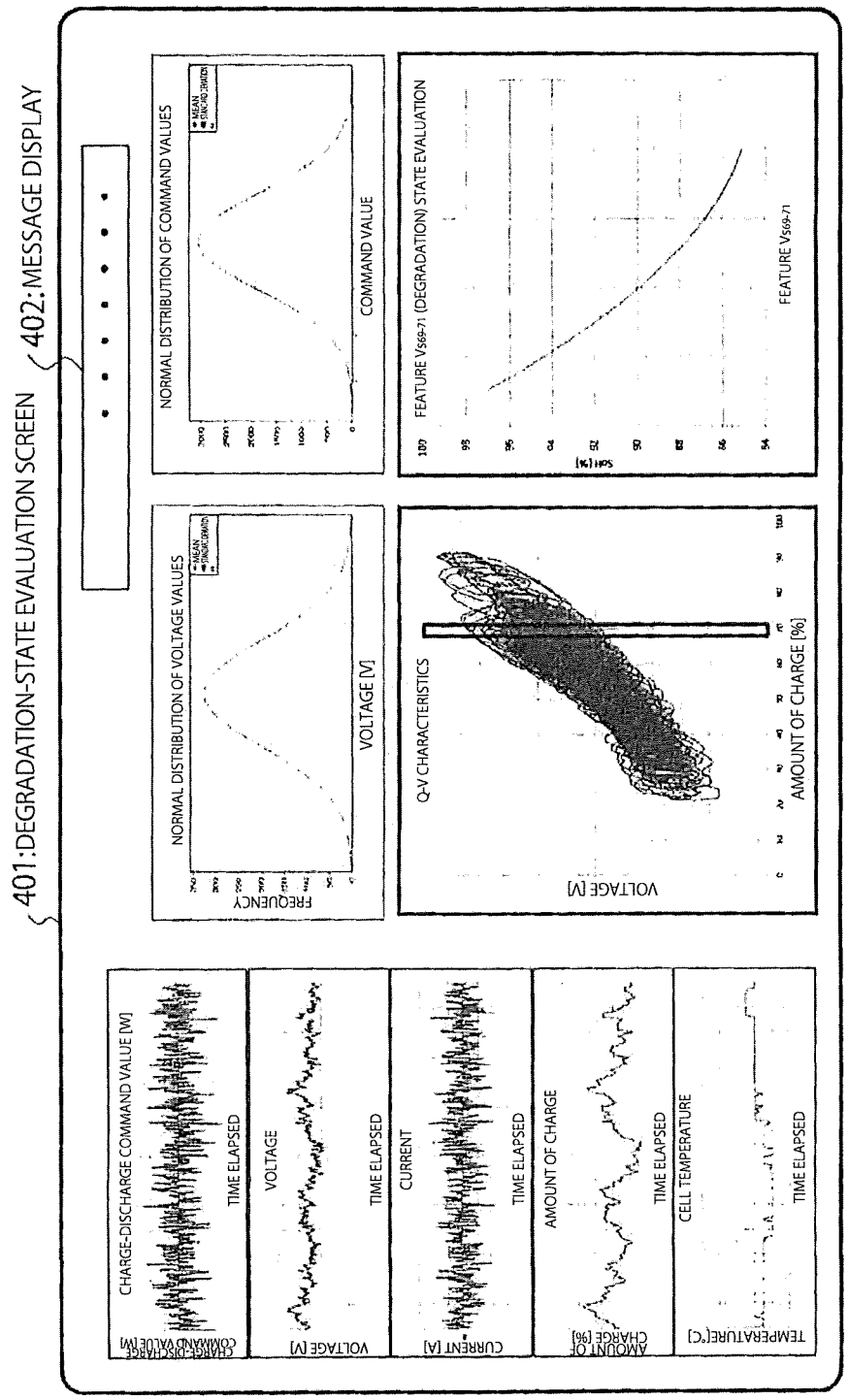
FIG. 14 shows an example of a degradation state evaluation screen.

FIG. 14 shows an example of a degradation state evaluation screen 401 displayed on the display device of the ESS monitor system 202. On the left side of the screen, the charge-discharge command value data (electric power command value data), the voltage data, the current data, the amount-of-charge data, and the temperature data are displayed against the time elapsed. At the center, the data on the normal distribution approximating the voltage distribution, and the QV data are displayed. On the right side, the data on the normal distribution approximating the distribution of the charge-discharge command values, and the evaluation function used for degradation evaluation are displayed. The administrator can monitor the state of the rechargeable battery 113 by viewing this screen. A message display 402 for displaying various messages is disposed on the degradation state evaluation screen. A message according to the state of the rechargeable battery is displayed on the message display 402. For example, when the rechargeable battery is determined to be not operable, the message of the failure alert, such as "Rechargeable battery has a failure," is displayed. " . . . " in the diagram represents a state where some message is displayed. The message may be displayed in another form, such as pop-up displaying.

Figure 15:
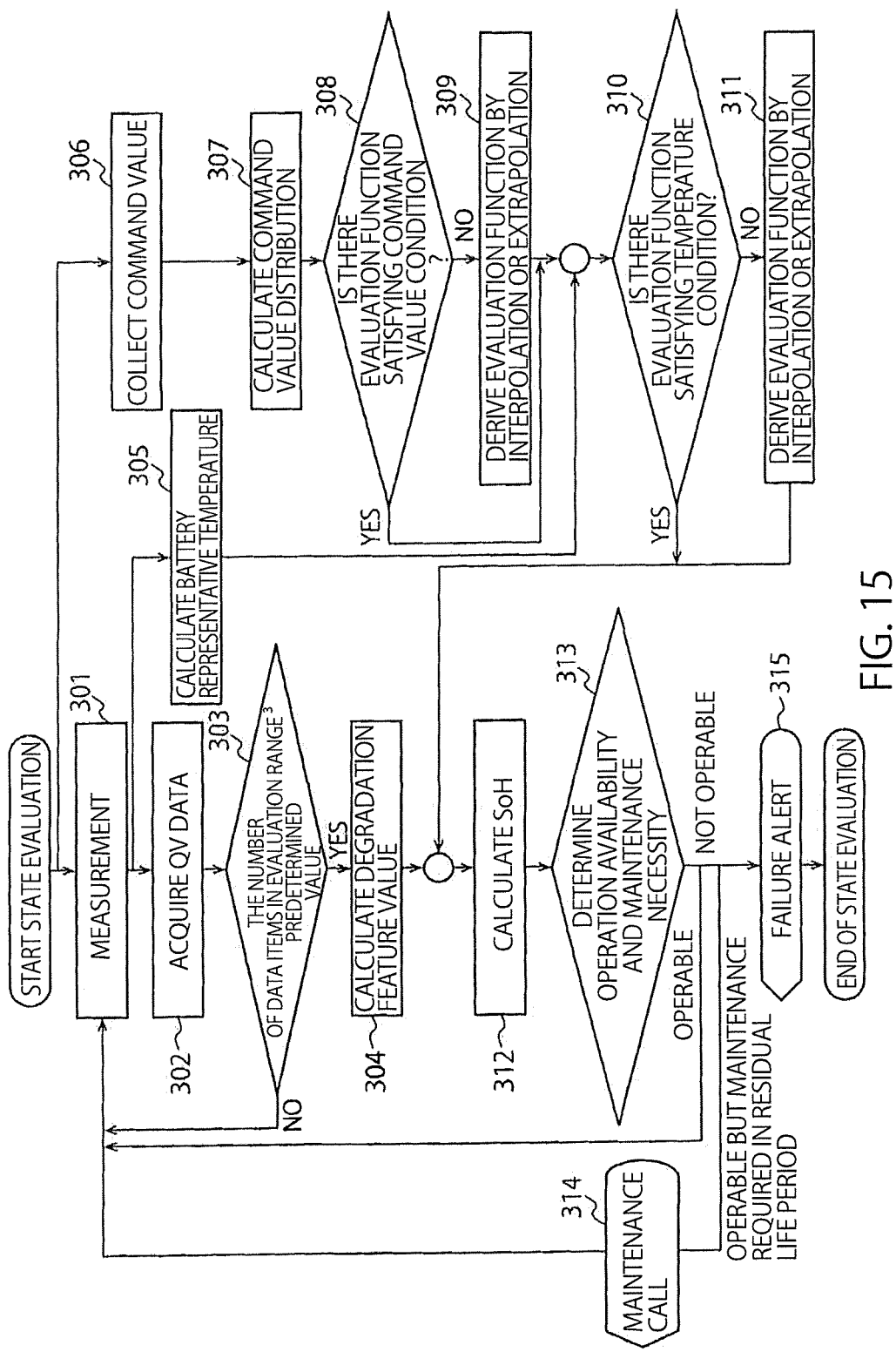
FIG. 15 shows a flowchart of an operation of the energy storage system according to an embodiment of the present invention.

FIG. 15 shows a flowchart of an operation of the energy storage system according to an embodiment of the present invention. This operation is started at any timing or a predetermined timing.

The charge-discharge controller 111 of the energy storage system converts the charge-discharge command value received from the SCADA 201 into the charge-discharge instruction, and outputs the instruction to the AC/DC converter 112. The AC/DC converter 112 charges and discharges the rechargeable battery 113 according to the charge-discharge instruction. The rechargeable battery evaluator 114 acquires the battery information, such as the voltage, current and temperature, measured during charge and discharge, and stores the acquired battery information in the information storage 151 (301).

The QV data generator 154 generates the QV data that includes a plurality of correspondence data items between the amounts of charge and the voltage values based on the battery information stored in the information storage 151 (302), and tests whether or not the number of correspondence data items (the number of samples) belonging to the predetermined amount-of-charge range is equal to or more than a predetermined value (303). If the number of correspondence data items is less than the predetermined value, the processing returns to Step 301. If the number of correspondence data items is equal to or more than the predetermined value, the feature value calculator 155 generates the voltage distribution that is the distribution of voltage values from the voltage values of the correspondence data items in the predetermined amount-of-charge range, and calculates the feature value (degradation feature value) associated with the variation in voltage values from the voltage distribution (304). The degradation feature value is, for example, the standard deviation, the variance or the like.

On the other hand, the energy storage system 101 accumulates the charge-discharge command value received from the SCADA 201 in the information storage 151 (306). The evaluation function deriver 157 identifies the charge-discharge command values belonging to the predetermined amount-of-charge range among the charge-discharge command values accumulated in the information storage 151, and generates the distribution of the identified charge-discharge command values (target command-value distribution) (307). The target command-value distribution is generated, for example, based on a number of charge-discharge command values; the number is equal to or more than a predetermined value. The predetermined value may be a value identical to or different from the predetermined value in Step 303.

The evaluation function deriver 157 calculates the temperature (representative temperature) of the evaluation-target rechargeable battery (305). The representative temperature may be, for example, the mean temperature over the evaluation-target period, the mean value of temperatures when the correspondence data items belonging to the predetermined amount-of-charge range are acquired, or a temperature predetermined by another method.

The evaluation function deriver 157 determines whether any evaluation function satisfying a command value condition is present or not for the target command-value distribution, based on the reference database 153 (308). For example, the standard deviation of the target command-value distribution is calculated, and when the reference distribution having a standard deviation having the same value as the calculated standard deviation (or in a predetermined range in the positive direction and the negative direction with respect to the calculated standard deviation) (called "an equivalent reference distribution") is registered in the reference database 153, it is determined that the evaluation function satisfying the command value condition is present (YES in 308). Specifically, the evaluation functions registered for the equivalent reference distribution at a plurality of temperatures (24.0, 36.0 and 40.0° C. in the example of FIG. 10) correspond to the evaluation functions satisfying the command value condition. According to another method, the 2-sample t-test (parametric method), which is one of methods of determining equivalence between two distributions, is used to determine the equivalence of the target command-value distribution with the reference distributions 1 to 3. If an equivalent reference distribution is present, it is determined that the evaluation function satisfying the command value condition is present. Specifically, the evaluation functions registered for the equivalent reference distribution at the plurality of temperatures correspond to the evaluation functions satisfying the command value condition.

If no evaluation function satisfying the command value condition is present (NO in 308), the evaluation function deriver 157 derives the evaluation function by interpolation or extrapolation (309). For example, the reference distribution having the standard deviation that is smaller and the closest to the standard deviation of the target command-value distribution, and the reference distribution having the standard deviation that is larger and the closest to the standard deviation of the target command-value distribution, are identified. The evaluation functions are derived for the identified two reference distributions, with respect to the temperature lower than and closest to the representative temperature, and the temperature higher than and closest to the representative temperature, among the temperatures registered in the reference database 153. If the evaluation functions corresponding to the same temperature as the representative temperature are present for the identified two reference distributions, the evaluation functions corresponding to the same temperature as the representative temperature may be selected.

The evaluation function deriver 157 determines whether or not the evaluation function satisfying a temperature condition is present among the evaluation functions satisfying the command value condition (310). If the evaluation function corresponding to the same temperature as the representative temperature is present among the evaluation functions satisfying the command value condition (YES in 310), it is determined that the evaluation function satisfying the temperature condition is present. In this case, the evaluation function satisfying the temperature condition is an evaluation function corresponding to the representative temperature. This evaluation function is determined as the evaluation function used for degradation evaluation, and the processing proceeds to Step 312.

If no evaluation function satisfying the temperature condition is present among the evaluation functions satisfying the command value condition (310), the evaluation function deriver 157 derives the evaluation function by interpolation or extrapolation from among the evaluation functions corresponding to a lower temperature and a higher temperature than the representative temperature with respect to the equivalent reference distribution (S311). The evaluation function derived in Step 311 is used as the evaluation function used for degradation evaluation, and the processing proceeds to Step 312.

If the evaluation functions are derived for the low temperature and the high temperature with respect to each of the identified two reference distributions in Step 309 described above, the evaluation function deriver 157 derives the evaluation function used for degradation evaluation by performing interpolation or extrapolation for the coefficients of the above derived evaluation functions, based on the representative temperature (311). Subsequently, the processing proceeds to Step 312.

If the evaluation functions having the same temperature as the representative temperature with respect to the identified two reference distributions described above are selected, the evaluation function deriver 157 may derive the evaluation function used for degradation evaluation, by performing interpolation or extrapolation for the selected evaluation functions. Subsequently, the processing proceeds to Step 312.

The SoH calculator 158 calculates the degradation state (SoH) of the rechargeable battery, based on the evaluation function derived by the evaluation function deriver 157 and the degradation feature value calculated by the feature value calculator 155 (312).

The maintenance planner 159 determines the operation state of the rechargeable battery based on the degradation state calculated by the SoH calculator 158. If the operation is available, the processing returns to Step 301. If it is determined that the operation is available but maintenance is required in a residual life period of the rechargeable battery, the message of the maintenance call is transmitted to the ESS monitor system 202 (314). When a predetermined finish condition is satisfied, this process may be finished. The predetermined finish condition may be a case where a predetermined time elapses, and a case where a finish instruction is issued by the administrator. If the operation state indicates not operable, the message of the failure alert is transmitted to the ESS monitor system 202 (315).

Figure 16:
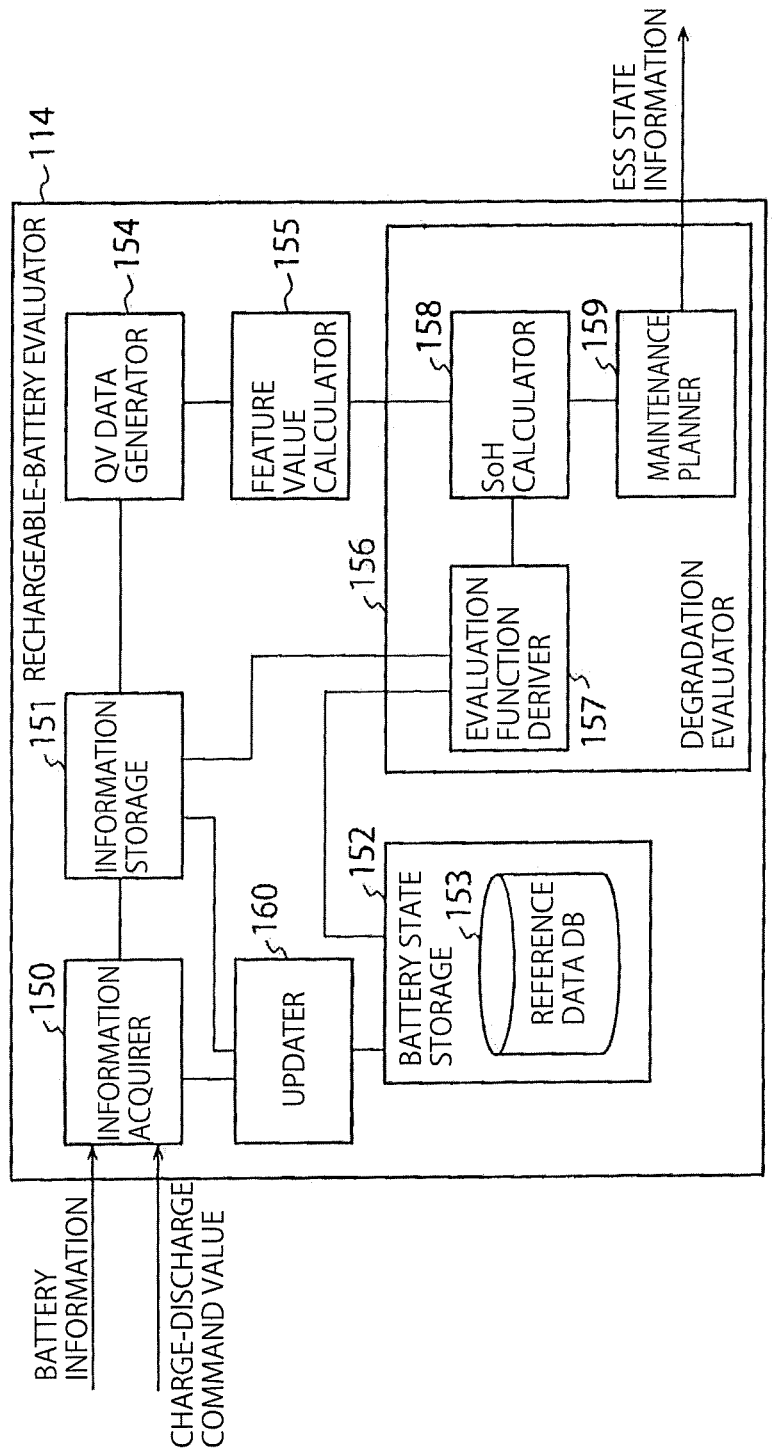
FIG. 16 is a block diagram showing another configuration example of a rechargeable battery evaluator.

FIG. 16 is a block diagram showing another configuration example of the rechargeable battery evaluator. An updater 160 is added. The updater 160 performs registration in and update for the reference data DB 153.

A plurality of rechargeable batteries in different degradation states are used as the rechargeable batteries 113. Based on predetermined charge-discharge command values, charge and discharge are performed for each of the rechargeable batteries, and measurement data for each rechargeable battery 113 is generated. The information acquirer 150 acquires the measurement data from the rechargeable battery 113. The updater 160 identifies the predetermined amount-of-charge range based on the measurement data, and generates the reference distribution. Furthermore, the evaluation function serving as a reference is generated. The coefficients of the generated evaluation function are registered in the reference database 153, or the reference database 153 is updated with these coefficients. The predetermined amount-of-charge range and the reference distribution may be predetermined.

The information acquirer 150 does not necessarily acquire the measurement data generated by actually charging and discharging the rechargeable battery. Alternatively, this acquirer may acquire measurement data by simulating charge and discharge using battery response models corresponding to the plurality of degradation states. In this case, the information acquirer 150 receives predetermined charge-discharge command values as an input and executes the battery response model, thereby acquiring the measurement data. The subsequent processes are analogous to those described above.

The information acquirer 150 may acquire measurement data on the rechargeable batteries in different degradation states from another device, such as a server (not shown), via the communication network. The updater 160 performs the processes analogous to those described above using this measurement data.

MODIFIED EXAMPLE 1

In the embodiment described above, the evaluation function is derived using only one representative temperature of the rechargeable battery. Alternatively, the evaluation function may be derived according to the time ratio of each temperature in the evaluation-target period. That is, for each temperature, the coefficients are calculated in a manner analogous to that in the case of the representative temperature, and the values of the calculated coefficients are weighted with the time ratio of each temperature, and the weighted values are added up. The coefficients used for degradation evaluation are thus derived. For example, it is assumed that temperatures "T1," "T2" and "T3 are in the evaluation-target period, and the total time of temperature "T1" is "C1," the total time of the temperature "T2" is "C2" and the total time of the temperature "T3" is "C3." It is also assumed that the time ratio of the temperature "T1" is R1 (=C1/(C1+C2+C3), and the time ratio of the temperature "T2" is R2 (=C2/(C1+C2+C3)), and the time ratio of the temperature "T3" is R3 (=C3/(C1+C2+C3)). The value of the coefficient "a" calculated for the temperature "T1" is "AA1," the value of the coefficient "a" calculated for the temperature "T2" is "AA2" and the value of the coefficient "a" calculated for the temperature "T3" is "AA3." In this assumption, the value of the coefficient "a" used for degradation evaluation is derived by AA1×R1+AA2×R2+AA3×R3. "x" is the multiplication symbol, and "+" is the addition symbol. Likewise, the coefficient "b" used for degradation evaluation can also be derived.

Modified Example 2

In the above-described embodiment, the distribution of the charge-discharge command values (electric power command values) belonging to the predetermined amount-of-charge range has been used as the target command-value distribution. Alternatively, the distribution of first derivative values (dP/dt) of the charge-discharge command values with respect to time may be used. In this case, for example, the distribution of the first derivatives of the charge-discharge command values with respect to time may be used as the reference command value distribution. Also in the case of using the distribution of the first derivative values, an analogous embodiment can be achieved by replacing the charge-discharge command values in the above description with the first derivative values of the charge-discharge command values with respect to time.

As described above, according to the embodiment of the present invention, in the energy storage system 101 where the current (charge-discharge current) output from and input into the electric power system 204 continuously varies, the battery state of the energy storage system 101 can be evaluated under a condition that the function of ESS such as suppression of the frequency variation is kept operating (i.e., without stopping the energy storage system 101).

According to the embodiment of the present invention, even if the target command-value distribution is different from the preliminarily registered reference distribution, the evaluation function used for degradation evaluation can be derived, and the degradation evaluation can be performed.

Figure 17:
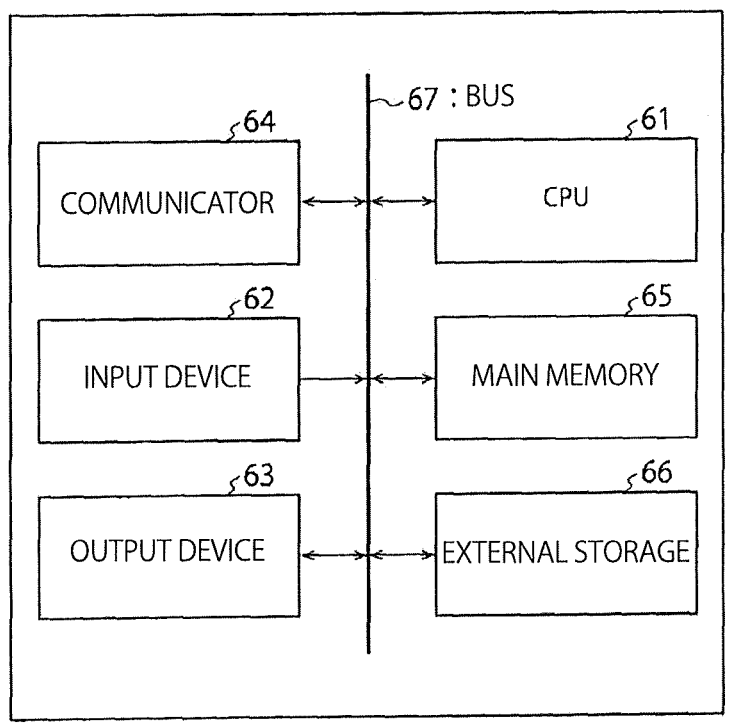
FIG. 17 shows a hardware configuration example according to an embodiment of the present invention.

FIG. 17 shows a hardware configuration example of the rechargeable battery evaluator 114 and the charge-discharge controller 111 in the energy storage system according to the embodiment of the present invention. The hardware configuration in FIG. 17 includes a CPU 61, an input device σ2, an output device 63, a communicator 64, a main memory 65, and an external storage 66, which are communicably connected to each other by a bus 67.

The input device 62 acquires the battery information measured at the rechargeable battery 113, via wiring or the like. The output device 63 outputs the charge-discharge instruction to the AC/DC converter 112. The communicator 64 includes a wireless or wired communicator, and communicates with the SCADA 201 and the ESS monitor system 202 by respective predetermined communication schemes. The input device σ2, the output device 63, and the communicator 64 may be made up of separate circuits, such as integrated circuits, or a single circuit, such as an integrated circuit.

Examples of the external storage 66 include storage media, such as HDD, SSD, a memory device, CD-R, CD-RW, DVD-RAM, and DVD-R. The external storage 66 stores a program for causing the CPU 61 serving as a processor to execute the functions of the rechargeable battery evaluator and the charge-discharge controller. The information storage 151 and the battery state storage 152 are also included in the external storage 66. Here, only one external storage 66 is shown. Alternatively, a plurality of external storages 66 may reside.

Under control by the CPU 61, a control program stored in the external storage 66 is deployed on the main memory 65, and data required to execute the program, data generated by execution of the program, etc. are stored thereon. The main memory 65 includes, for example, any type of memory or storage, such as a volatile memory (DRAM, SRAM, etc.) or a non-volatile memory (NAND flash memory, MRAM, etc.). The control program deployed on the main memory 65 is executed by the CPU 61, thereby executing the functions of the rechargeable battery evaluator 114 and the charge-discharge controller 111.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing device, comprising:
    first processing circuitry configured to calculate a feature value of an energy storage device based on voltage values measured from the energy storage device being subjected to charge-discharge-control according to charge-discharge command values; and
    second processing circuitry configured to:
        derive an evaluation function of a state of the energy storage device according to a difference between a distribution of the charge-discharge command values and a reference distribution; and
        evaluate the state of the energy storage device, based on the evaluation function and the calculated feature value.

2. The information processing device according to claim 1, wherein
    the second processing circuitry derives a coefficient according to the difference between the distribution of the charge-discharge command values and the reference distribution, and
    the second processing circuitry evaluates the state of the energy storage device, using the evaluation function that includes a variable assigned the feature value and includes the coefficient.

3. The information processing device according to claim 1, further comprising
a reference database configured to hold coefficients, for a plurality of the reference distributions,
wherein
the second processing circuitry selects one or more of the reference distributions, based on the distribution of the charge-discharge command values, and
the second processing circuitry calculates the coefficient of the evaluation function by performing interpolation or extrapolation based on coefficients corresponding to the selected one or more reference distributions.

4. The information processing device according to claim 3, wherein
the reference database holds the coefficients for a plurality of pairs of: the reference distributions; and reference temperatures,
the second processing circuitry selects one or more reference temperatures from among the reference temperatures, based on a temperature of the energy storage device, and
the second processing circuitry calculates the coefficient of the evaluation function by performing interpolation or extrapolation based on the coefficients corresponding to one or more pairs of the selected reference distributions and the selected reference temperatures.

5. The information processing device according to claim 1, wherein
the difference between the distribution of the charge-discharge command values and the reference distribution includes a difference between a variation in the charge-discharge command values and a variation in the reference distribution.

6. The information processing device according to claim 1, wherein
the first circuitry identifies the voltage value of the energy storage device corresponding to an amount of charge of the energy storage device when the amount of charge of the energy storage device belongs to a first amount-of-charge range in accordance with the charge-discharge-control based on the charge-discharge command values; and
the first circuitry calculates the feature value of the energy storage device, based on the identified voltage value.

7. The information processing device according to claim 6,
wherein the feature value is a value representing a variation in voltage values.

8. The information processing device according to claim 3, further comprising:
third processing circuitry configured to acquire measurement data on charge and discharge performed using a plurality of the energy storage devices in different states; and
fourth processing circuitry configured to:
generate the coefficient based on the measurement data, and
register the generated coefficient in the reference database or update the reference database based on the generated coefficient.

9. The information processing device according to claim 3, further comprising:
third processing circuitry configured to acquire measurement data by simulating charge and discharge using a plurality of battery response models corresponding to a plurality of states; and
fourth processing circuitry configured to:
generate the coefficient based on the measurement data, and
register the generated coefficient in the reference database or update the reference database based on the generated coefficient.

10. The information processing device according to claim 3, further comprising:
third processing circuitry configured to acquire measurement data on a plurality of the energy storage devices in different states via a communication network; and
fourth processing circuitry configured to:
generate the coefficient based on the measurement data, and
register the generated coefficient in the reference database or to update the reference database based on the generated coefficient.

11. The information processing device according to claim 10, wherein
the second processing circuitry transmits information on the state of the energy storage device to a monitor system for the energy storage device via the communication network.

12. The information processing device according to claim 1,
wherein the energy storage device is
a cell,
a module including a plurality of the cells connected to each other in series, in parallel, or in series and parallel,
a battery unit including a plurality of the modules connected to each other in series, in parallel, or in series and parallel, or
a battery array including a plurality of the battery units connected to each other in series, in parallel, or in series and parallel.

13. An information processing system, comprising:
an energy storage device;
charge and discharge controlling circuitry configured to perform charge-discharge-control according to charge-discharge command values;
first processing circuitry configured to calculate a feature value of the energy storage device based on voltage values measured from the energy storage device being; and
second processing circuitry configured to:
derive an evaluation function of a state of the energy storage device according to a difference between a distribution of the charge-discharge command values and a reference distribution; and
evaluate the state of the energy storage device, based on the evaluation function and the calculated feature value.

14. An information processing method, comprising:
measuring from an energy storage device voltage values of the energy storage device subjected to charge-discharge-control according to charge-discharge command values;
calculating a feature value of the energy storage device based on the voltage values measured from the energy storage device being subjected to the charge-discharge-control according to the charge-discharge command values;
generating an evaluation function of a state of the energy storage device according to a difference between a distribution of the charge-discharge command values and a reference distribution;

evaluating the state of the energy storage device, based on the evaluation function and the calculated feature value; and outputting an indication of the state of the energy storage device including outputting a failure alert if the output state indicates a not operable state.

15. A non-transitory computer readable medium having a computer program stored therein which when the computer program is executed by a computer, causes the computer to perform processes comprising:

measuring from an energy storage device voltage values of the energy storage device subjected to charge-discharge-control according to charge-discharge command values;

calculating a feature value of the energy storage device based on the voltage values measured from the energy storage device being subjected to the charge-discharge-control according to the charge-discharge command values;

generating an evaluation function of a state of the energy storage device according to a difference between a distribution of the charge-discharge command values and a reference distribution;

evaluating the state of the energy storage device, based on the evaluation function and the calculated feature value; and outputting an indication of the state of the energy storage device including outputting a failure alert if the output state indicates a not operable state.

16. The information processing device according to claim 1, wherein the state of the energy storage device is a degradation state of the energy storage device.

17. The information processing system according to claim 13, wherein the state of the energy storage device is a degradation state of the energy storage device.

18. The information processing method according to claim 14, wherein the state of the energy storage device is a degradation state of the energy storage device.

19. The non-transitory computer readable medium according to claim 15, wherein the state of the energy storage device is a degradation state of the energy storage device.

* * * * *